US009612275B2

(12) United States Patent
Choi et al.

(10) Patent No.: US 9,612,275 B2
(45) Date of Patent: Apr. 4, 2017

(54) POWER DEVICE INCLUDING CURRENT TRANSFORMER AND METHOD FOR COMPENSATING OF CURRENT TRANSFORMER

(71) Applicant: LSIS CO., LTD., Anyang-si, Gyeonggi-do (KR)

(72) Inventors: Yong Kil Choi, Gunpo-si (KR); Ho Seok Choi, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 103 days.

(21) Appl. No.: 14/524,482

(22) Filed: Oct. 27, 2014

(65) Prior Publication Data

US 2015/0160288 A1    Jun. 11, 2015

(30) Foreign Application Priority Data

Dec. 5, 2013    (KR) .................. 10-2013-0150706

(51) Int. Cl.
 *G01R 31/28* (2006.01)
 *G01R 21/00* (2006.01)
 *H01F 27/42* (2006.01)

(52) U.S. Cl.
 CPC ......... *G01R 31/2837* (2013.01); *G01R 21/00* (2013.01); *G01R 31/2843* (2013.01); *H01F 27/42* (2013.01)

(58) Field of Classification Search
 CPC   G01R 31/2837; G01R 31/2843; G01R 21/00; H01F 27/42
 USPC .................. 324/547, 546, 537, 500
 See application file for complete search history.

(56) References Cited

U.S. PATENT DOCUMENTS

| | | | | |
|---|---|---|---|---|
| 4,217,546 A | * | 8/1980 | Milkovic | G01R 21/00 324/142 |
| 4,887,028 A | * | 12/1989 | Voisine | G01R 21/00 323/356 |
| 5,058,031 A | * | 10/1991 | Swanson | H02H 7/09 361/22 |

(Continued)

FOREIGN PATENT DOCUMENTS

| | | |
|---|---|---|
| JP | 0989939 | 4/1997 |
| JP | 11136849 | 5/1999 |

(Continued)

OTHER PUBLICATIONS

European Patent Office Application Serial No. 14191198.2, Search Report dated May 4, 2015, 8 pages.

(Continued)

*Primary Examiner* — Hoai-An D Nguyen
(74) *Attorney, Agent, or Firm* — Lee, Hong, Degerman, Kang & Waimey PC (57) ABSTRACT

A power device having a current transformer according to an embodiment includes: first to Nth current transformers; an integrated measurement panel connected to the first to Nth transformers and configured to measure actual current values of locations where the first to Nth transformers are installed using current values detected by the first to Nth transformers, wherein the integrated measurement panel stores compensation values for compensating errors of linearity characteristics of the first to Nth current transformers, and measures the actual current values by applying the stored compensation values.

10 Claims, 8 Drawing Sheets

(56) References Cited

U.S. PATENT DOCUMENTS

| | | | |
|---|---|---|---|
| 5,737,730 A * | 4/1998 | Alvarenga | G06Q 50/06 |
| | | | 324/140 D |
| 6,429,637 B1 | 8/2002 | Gandhi | |
| 7,305,310 B2 * | 12/2007 | Slota | G01R 35/04 |
| | | | 324/601 |
| 2005/0240362 A1 | 10/2005 | Randall | |
| 2008/0024114 A1 | 1/2008 | Weng et al. | |
| 2011/0148431 A1 * | 6/2011 | Satou | G01R 31/027 |
| | | | 324/547 |

FOREIGN PATENT DOCUMENTS

| | | |
|---|---|---|
| JP | 2002107387 | 4/2002 |
| JP | 2007205971 | 8/2007 |

OTHER PUBLICATIONS

Japan Patent Office Application No. 2014-228686, Office Action dated Mar. 1, 2016, 2 pages.

* cited by examiner

POWER DEVICE INCLUDING CURRENT TRANSFORMER AND METHOD FOR COMPENSATING OF CURRENT TRANSFORMER

CROSS-REFERENCE TO RELATED APPLICATIONS

Pursuant to 35 U.S.C. §119(a), this application claims the benefit of earlier filing date and right of priority to Korean Patent Application No. 10-2013-0150706, filed on Dec. 5, 2013, the contents of which are hereby incorporated by reference herein in its entirety.

BACKGROUND

The present disclosure relates to a current transformer for a meter, and more particularly, to a power device including a current transformer for minimizing a current measurement error that occurs due to a linearity characteristic difference of the current transformer for a meter and a compensation method for the current transformer.

A current transformer for a meter is applied to any product for measuring and processing a current value. Such a current transformer is mounted or installed on a location where a current is to be measured.

In the current transformer, a part for actually measuring a current and an actual current measured thereby are referred to as a primary side and a primary-side current. Furthermore, a part for transforming the actual current into a processable current and the current obtained by the transforming are referred to as a secondary side and a secondary-side current.

In general, since the primary-side current of the current transformer is a high current that is difficult to be processed, a transformation ratio for transforming the high current is set. Here, the transformation ratio may be a current value ratio between the primary side and the secondary side.

For example, in the case where the value of the current of the primary side, i.e., the value of the actual current, is 400 A and the current value of 400 A is changed to 5 A or 5 V in the secondary side, the transformation ratio is 400:5.

The transformation ratio has a linearity according to a current measurement range of the primary side.

Figure 1:
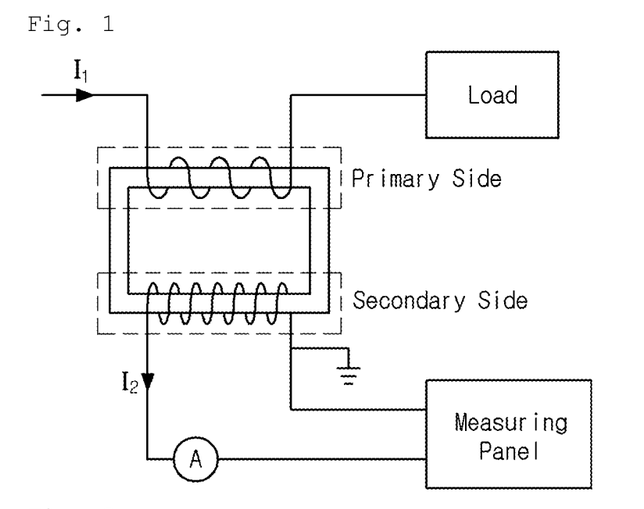
FIG. 1 is a diagram illustrating an operation principle of a typical current transformer.
Figure 2:
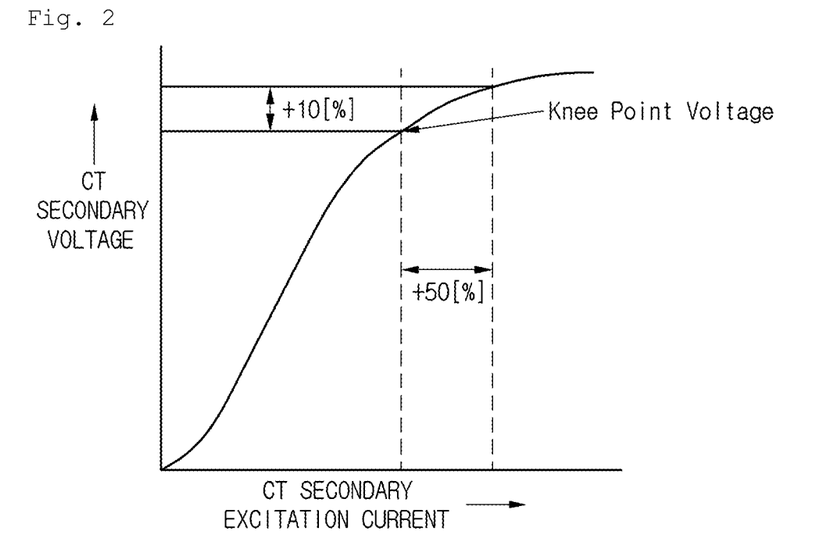
FIG. 2 is a graph illustrating a linearity characteristic of the typical current transformer.

FIG. 1 is a diagram illustrating an operation principle of a typical current transformer, and FIG. 2 is a graph illustrating a linearity characteristic of the typical current transformer.

The principle of measuring a high current of the current transformer will be described with reference to FIGS. 1 and 2. A high current of a primary side induces a magnetic field according to the Ampere's law.

This magnetic flux ($\Phi$) is transferred through an iron core and is interlinked with a secondary side winding so that an electromotive force (E) is induced.

The intensity of the induced electromotive force is based on the Faraday's law of electromagnetic induction, and the direction of the induced electromotive force is determined by the Lenz's law.

That is, the magnetic flux and the electromotive are generated in a direction that offsets a change of the magnetic flux, and, accordingly, a current of a secondary side is generated.

That is, a current transferred to a load is transferred to the primary side of the current transformer, and the current transferred to the primary side is transferred to the secondary side having a value changed according to a turns ratio. Furthermore, a measurement panel is connected to the secondary side, so that the value of the current supplied to the load is measured by reading the value of the current of the secondary side and then applying the turns ratio.

Here, the primary-side current and the secondary-side current are inversely proportional to the turns ratio, and are expressed as the following equation.

$$E = N \times \frac{d\Phi}{dt} \quad (1)$$

$$I2 = I1 \times \frac{N1}{N2}$$

Where, E denotes an electromotive force, I1 denotes a primary-side current, I2 denotes a secondary-side current, N1 denotes the number of turns of a primary side, and N2 denotes the number of turns of a secondary side.

As illustrated in FIG. 2, the current transformer has different linearity characteristics in a low-current region, a middle-current region and a high-current region.

Here, the high-current region, which is outside a region represented by a knee point voltage, is a saturation region where an error of the current transformer increases.

When the primary-side current is increased, the secondary-side current is also increased according to the transformation ratio. However, when arriving at an uppermost limit, the secondary current is saturated and is not increased any more even though the primary current is still increased. At the saturation point, an excitation current becomes 50% when an excitation voltage is increased by 10%, wherein the excitation current is measured by opening the primary winding of the current transformer and increasing an AC voltage with a rated frequency of the secondary winding.

In general, in a saturation characteristic test, an applied voltage at a saturation point is referred to as a saturation voltage. The saturation voltage should be sufficiently high so as to secure protection in the high-current region.

Such current transformers differ with respect to the linearity characteristic even though the current transformers are identical products manufactured by the same manufacturer.

Therefore, current transformers undergo a test in order to be applied to a system. The test may be classified into a shop test and a field test.

The shop test includes a type test performed on sample products in order to check and verify the characteristics of current transformers and a routine test performed on all products in order to evaluate the performance of all products.

After evaluating the performance of individual products through the shop test, the products are applied to a system so as to undergo the field test through procedures such as a component test and a linking test.

The current transformers as described above are applied to a large-scale power system such as a high voltage direct current (HVDC) transmission system or a product or system for transforming power. Such systems are designed so as to measure current at multiple places to control or protect the systems.

The current transformers applied as described above have different linearity characteristics according to a current range even though the current transformers are identical products. Although a verification test is performed to test the current transformers applied to a product or a system, a problem due to a linearity difference may highly possibly occur in a system in which the transformation ratio is high or two or more current transformers are applied.

In this case, even though a current of the same route is measured at multiple places, a current measurement error may occur due to a difference of linearity characteristics of current transformers installed on the places. Such an error may be recognized as system failure, may cause generation of an alarm, or may even cause an interruption of system operation.

In addition, since the current transformers as described above have different linearity characteristics, one measurement panel should be connected to one current transformer, causing an increase of the unit cost of products.

SUMMARY

Embodiments provide a power device for compensating a linearity characteristic of each current transformer of the power device and a compensation method for a current transformer.

Embodiments also provide a power device for improving the reliability and stability of a system by reducing an error of current measurement caused by individual linearity characteristics installed on power transmission lines, and a compensation method for a current transformer.

In one embodiment, a power device having a current transformer includes: first to Nth current transformers; an integrated measurement panel connected to the first to Nth transformers and configured to measure actual current values of locations where the first to Nth transformers are installed using current values detected by the first to Nth transformers, wherein the integrated measurement panel stores compensation values for compensating errors of linearity characteristics of the first to Nth current transformers, and measures the actual current values by applying the stored compensation values.

The compensation values may compensate a linearity characteristic of a specific current transformer which differs from an average value of the linearity characteristics of the first to Nth current transformers.

The compensation value may include compensation conditions for compensating a difference with the average value for each current interval, and the compensation conditions may include at least one of a current change ratio, an offset value and a gain value.

In another embodiment, a compensation method for a current transformer includes: confirming linearity characteristics of measured currents of a plurality of current transformers; calculating an average value of the linearity characteristics of the plurality of current transformers; confirming a current transformer of which a linearity characteristic differs from the average value; and determining a compensation value for compensating the linearity characteristic of the confirmed current transformer with the average value.

The determining may include: confirming a current interval where the linearity characteristic of the confirmed current transformer differs from the average value; confirming an error value with respect to the average value in the confirmed current interval; and determining the compensation value using the error value.

The determining the compensation value may include changing at least one of a current change ratio, an offset value and a gain value for recognizing a current value measured by the confirmed current transformer as the average value in the confirmed current interval.

The compensation method may further include applying the compensation value to an integrated measurement panel commonly connected to the plurality of current transformers when the compensation value is determined.

The compensation method may further include: performing a type test on some of the plurality of current transformers; and performing a routine test on all of the plurality of current transformers.

The compensation method may further include performing a test of linkage with an integrated measurement panel commonly connected to the plurality of current transformers by applying the determined compensation value.

The details of one or more embodiments are set forth in the accompanying drawings and the description below. Other features will be apparent from the description and drawings, and from the claims.

DETAILED DESCRIPTION OF THE EMBODIMENTS

Embodiments will be described with reference to the accompanying drawings.

Figure 3:
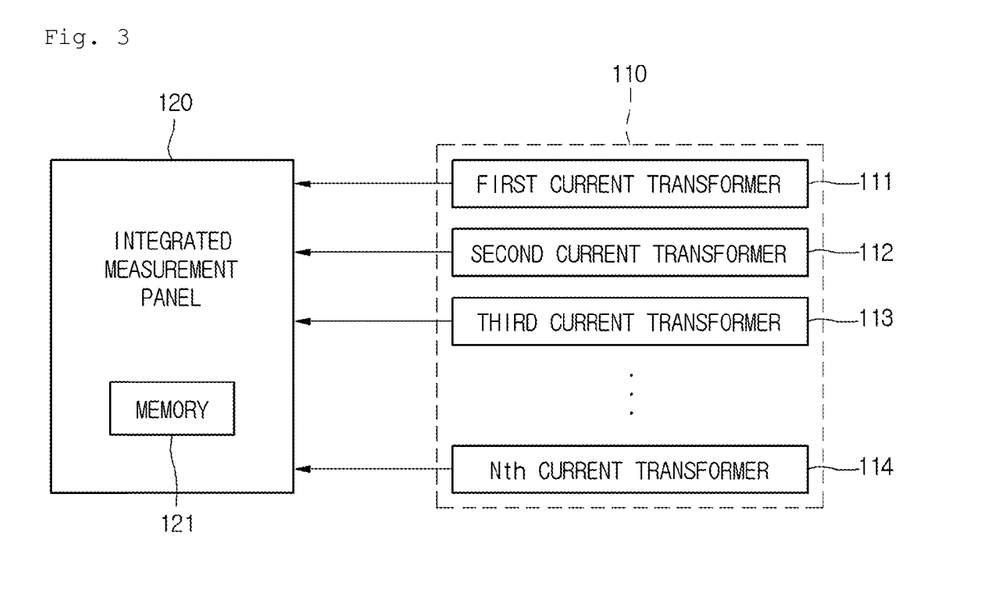
FIG. 3 is a diagram illustrating a power device including a current transformer according to an embodiment.

FIG. 3 is a diagram illustrating a power device including a current transformer according to an embodiment.

Referring to FIG. 3, the power device includes a plurality of current transformers 110 and an integrated measurement panel 120.

The plurality of current transformers 110 include a first current transformer 111, a second transformer 112, a third current transformer 113, and an Nth current transformer 114.

The first to Nth current transformers 111 to 114 may be installed at different locations to measure values of currents passing through the installation locations and transfer the measured current values to the integrated measurement panel 120.

The first to Nth current transformers 111 to 114 may be products manufactured by the same manufacturer, or may be products manufactured by different manufacturers.

The first to Nth current transformers 111 to 114 are meters for detecting currents that flow through electric lines due to an electromagnetic induction phenomenon according to the Faraday's law. Detected values are transferred to a meter electrically connected the first to Nth current transformers 111 to 114, i.e., the integrated measurement panel 120 so as to be displayed on the integrated measurement panel 120.

The integrated measurement panel 120 is electrically connected to the first to Nth current transformers 111 to 114, and receives the current values detected by the first to Nth current transformers.

Furthermore, the integrated measurement panel 120 compensates errors of the current values detected by the first to Nth current transformers 111 to 114 using the received current values, and displays compensated current values.

According to the prior art, one individual measurement panel should be connected to one current transformer, since the first to Nth current transformers 111 to 114 have different linearity characteristics. In this case, the current values detected by the current transformers may be checked by individual measurement panels. Here, the linearity characteristics represent characteristics of detected current values of the current transformers. In other words, the linearity characteristics represent a relation between an input current value and a detected current value.

According to the present disclosure, current values detected by a plurality of current transformers are checked through one integrated measurement panel 120, and obtains actual current values of respective locations where the plurality of current transformers are installed using the checked current values.

Here, the linearity characteristics of the first to Nth current transformers 111 to 114 are standardized by a pre-operation.

Information on the standardized first to Nth current transformers 111 to 114 is stored in the integrated measurement panel 120.

The integrated measurement panel 120 includes a memory 121 that includes a compensation value for compensating the errors of the current values detected by the first to Nth current transformers 111 to 114.

Here, the compensation value is for standardizing the linearity characteristics of the first to Nth current values 111 to 114 to an average value of the linearity characteristics of the first to Nth current transformers, for each of the first to Nth current values 111 to 114.

For example, when the linearity characteristics of ten current transformers are checked, most of the current transformers show normal linearity characteristics, but there may exist a current transformer having a linearity characteristic different from a normal linearity characteristic.

Here, an average value of the linearity characteristics of the ten current transformers falls within a normal range of a linearity characteristic, but the respective linearity characteristics of the current transformers are outside the normal range.

Therefore, for the current transformer having an abnormal linearity characteristic, a compensation value for compensating the abnormal linearity characteristic with the average value is set, and the set compensation value is stored in the memory 121 of the integrated measurement panel 120.

Thereafter, the integrated measurement panel 120 compensates the current values detected by the current transformers using the compensation value stored in the memory 121. Furthermore, the integrated measurement panel 120 outputs the compensated current values as final detection values.

Here, the compensation value is stored in the memory 121 for each current transformer, and the compensation value of each current transformer includes values for compensating detection values for each current interval.

The current interval represents a range of actually supplied current.

For example, the current interval may be divided into a low-current interval, a middle-current interval and a high-current interval. Furthermore, each of the low-current interval, the middle-current interval and the high-current interval may be divided into a plurality of intervals.

The compensation value includes values for compensating corresponding detection values for each interval.

For example, in the case of the first current transformer 111, since an error occurs within a current interval of from about 150 A to about 160 A, the compensation value for compensating this error may be stored in the memory 121.

Here, the compensation value, which is a standardized average value of the linearity characteristics of the plurality of current transformers, is for adjusting the linearity characteristic of the first current transformer 111.

The compensation value includes conditions for compensating a current value detected by a corresponding current transformer for each current interval. Here, the conditions may include any one of a change ratio (or referred to as a "transformation ratio"), an offset and a gain value.

That is, the memory 121 stores compensation values for each current transformer. The compensation values for each current transformer include any one of the change ratio, the offset and the gain value for compensating a corresponding detected current value for each current interval according to a current measurement range (or a current application range).

It is assumed that the primary current value is required to be about 100 A and the secondary current value is required to be about 10 A, to provide an example. In the case where the primary current value actually measured is about 100 A but the secondary current value is about 15 A, a compensation condition for recognizing the secondary current value of about 15 A as about 10 A is a compensation value. That is, in a preset first current interval, the primary current value may be recognized as about 100 A even though the secondary current value is confirmed as about 15 Å. This is because the integrated measurement panel 120 confirms the ratio of 100:10 in another current interval but may recognize the primary current value on the basis of the ratio of 20:3 in the first current interval. Therefore, in the first current interval, the primary current value may be recognized as about 100 A even though the secondary current value is about 15 A.

When the current value detected by the first current transformer 111 is transferred to the integrated measurement panel 120, the integrated measurement panel 120 confirms a current interval where the current value has been detected, and checks whether it is necessary to compensate an error in the confirmed current interval for the first current transformer 111.

That is, the integrated measurement panel 120 checks whether a pre-stored compensation value for the first current transformer 111 exists in the confirmed current interval.

Furthermore, if the compensation value exists, the integrated measurement panel 120 compensates the detected current value using the compensation value, and confirms the primary current value of the installation location of the first current transformer 111 using the compensated current value.

If the compensation value does not exist, the integrated measurement panel 120 confirms the primary current value of the installation location of the first current transformer 111 using the detected current value.

According to an embodiment, a current measurement error may be minimized by compensating an error of the linearity characteristic of each current transformer, so that the performance of a current transformer applied to a system is standardized to thereby achieve secure protection of the system and improve the reliability and stability of the system.

Furthermore, according to an embodiment, review and analysis on linearity modeling of each current transformer are performed to apply a compensation value for compensating an error of each current transformer, so that a plurality of current transformers may be connected to one integrated measurement panel, thereby reducing the manufacturing cost.

Figure 4:
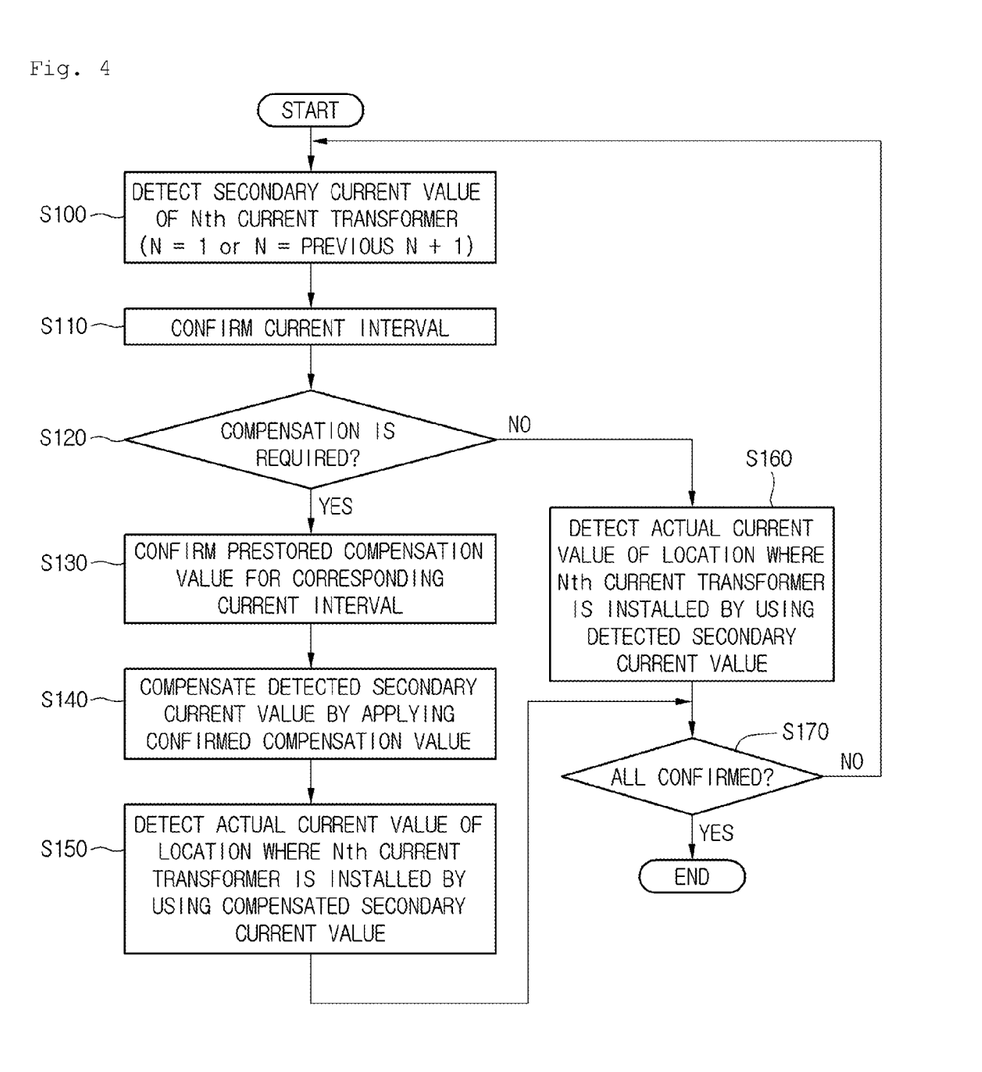
FIG. 4 is a flowchart illustrating a compensation method for a current transformer of a power device according to an embodiment.

FIG. 4 is a flowchart illustrating a compensation method a current transformer of a power device according to an embodiment.

Referring to FIG. 4, the first to Nth current transformers 111 to 1114 are installed on a transmission line to detect a current flowing through the transmission line. Here, the current detection includes primary current detection and secondary current detection in which a primarily detected current is transformed according to a preset transformation ratio.

When the current detection is performed by the first to Nth current transformer 111 to 114, the integrated measurement panel 120 confirms a current value of the first current transformer 111 (operation 100).

Furthermore, the integrated measurement panel 120 confirms a detection value detected by the first current transformer 111, and confirms a current interval of the confirmed detection value (operation 110).

When the current interval is confirmed, the integrated measurement panel 120 determines whether error compensation for the confirmed current interval is necessary with respect to the first current transformer 111 (operation 120).

As a result of the determination (operation 120), if the error compensation for the current interval is necessary, the integrated measurement panel 120 confirms a pre-stored compensation value of the current interval (operation 130).

When the compensation value is confirmed, the integrated measurement panel 120 applies the confirmed compensation value so as to compensate the secondary-side current value detected by the first current transformer 111 (operation 140). Here, as described above, the compensation value includes any one of a current transformation ratio setting change, an offset value setting change and a gain value setting change.

Furthermore, the integrated measurement panel 120 detects an actual current value of the installation location of the first current transformer 111 using the compensated current value (operation 150). That is, even though an error occurs in the current transformer, the primary current value may be correctly recognized according to a calculated compensation value.

As a result of the determination (operation 120), if the error compensation for the current interval is not necessary, the integrated measurement panel 120 detects the actual current value of the installation location of the first current transformer 111 using the detected secondary current value (operation 160).

Thereafter, the integrated measurement panel 120 determines whether an actual current value detection process has been completed for all current transformers (operation 170). If the actual current value detection process has been completed for all current transformers, the integrated measurement panel 120 finishes the procedure. Otherwise, the procedure returns to operation 100 so that the integrated measurement panel 120 detects an actual current value with respect to a next current transformer.

Hereinafter, a process of determining a compensation value for compensating an error of the linearity characteristic of a current transformer will be described.

Figure 5:
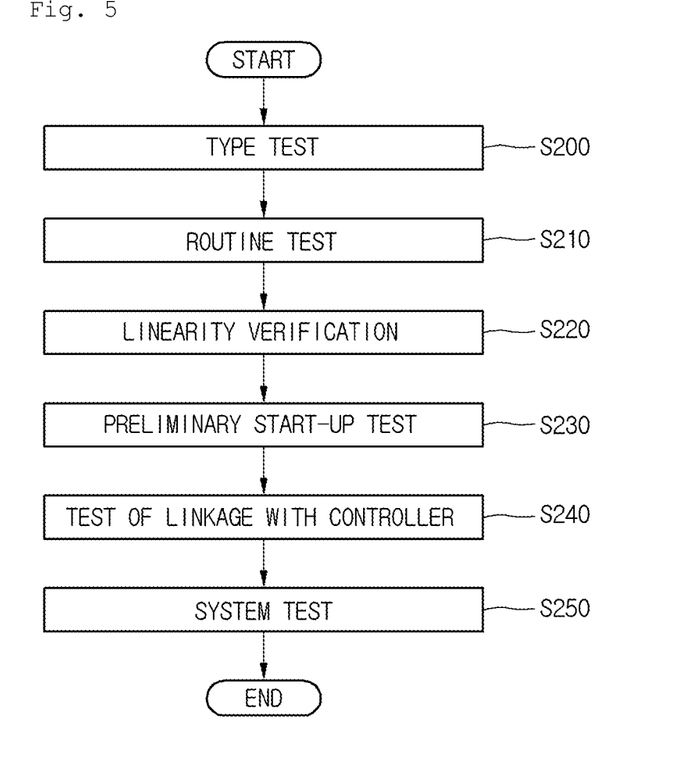
FIG. 5 is a flowchart illustrating a compensation method for a current transformer according to an embodiment.

FIG. 5 is a flowchart illustrating a compensation method for a current transformer according to an embodiment.

Referring to FIG. 5, when current transformers are completely manufactured, a type test is performed to check and verify the linearity characteristics of specific sample products among the manufactured current transformers (operation 200). When the type test is finished, a routine test is performed to evaluate the performance of all the manufactured current transformers (operation 210).

Thereafter, when the routine test is completed, the linearity characteristics of the current transformers are verified so as to determine a compensation value for standardizing the linearity characteristics to an average value of the linearity characteristics of all the current transformers (operation 220).

That is, all the current transformers should show the same linearity characteristic so as to avoid a problem that may occur due to a difference between current values detected by the plurality of current transformers installed on the same transmission line.

Therefore, according to the present disclosure, the linearity characteristics of the manufactured current transformers are confirmed and the average value of the confirmed linearity characteristics is calculated so that, with respect to current transformers having serious errors in each current interval, the errors are compensated in the current intervals so that the current transformers have linearity characteristics equal to the average value.

Thereafter, when the compensation value is determined, the determined compensation value is applied so as to perform a preliminary start-up test on all the manufactured current transformers (operation 230).

When the preliminary start-up test is completed normally, the current transformers are linked to other devices so as to perform a linking test for confirming operation states of the current transformers (operation 240).

When the linking test is completed normally, the current transformers are installed in an actual system, and a system test is performed to confirm the operation states of the current transformers in the system (operation 250).

Figure 6:
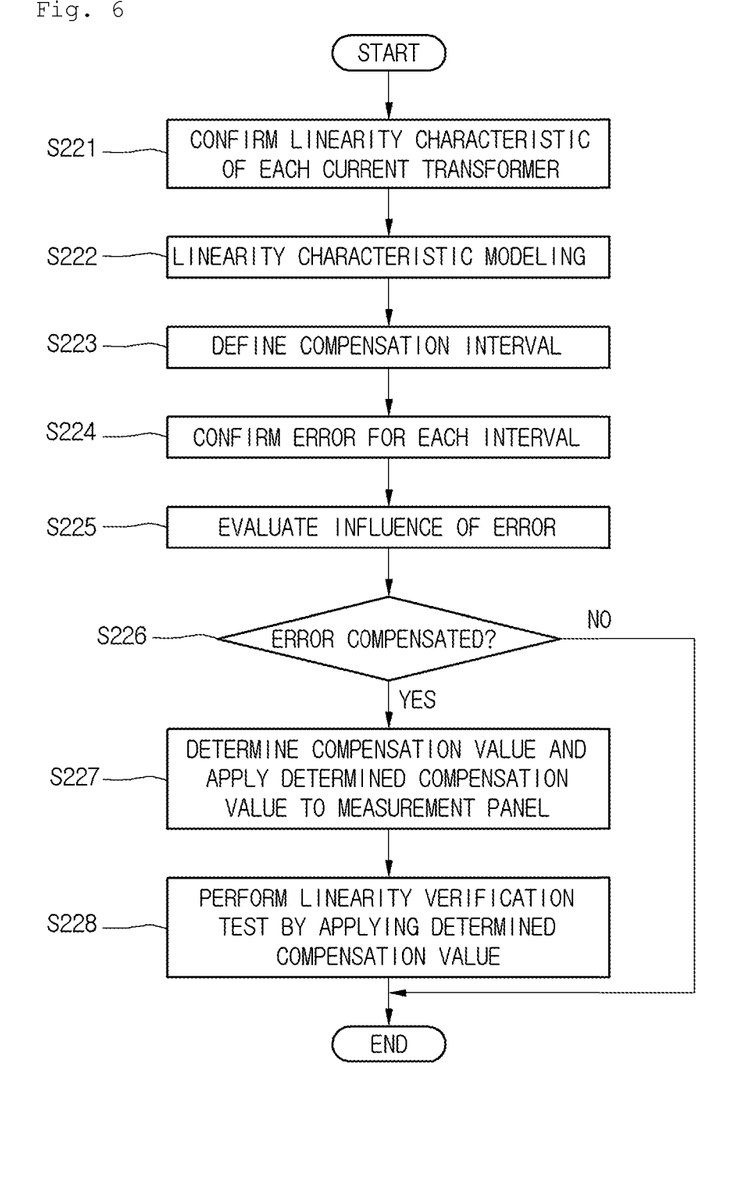
FIG. 6 is a flowchart more specifically illustrating the compensation value determining process illustrated in FIG. 5.
Figure 7:
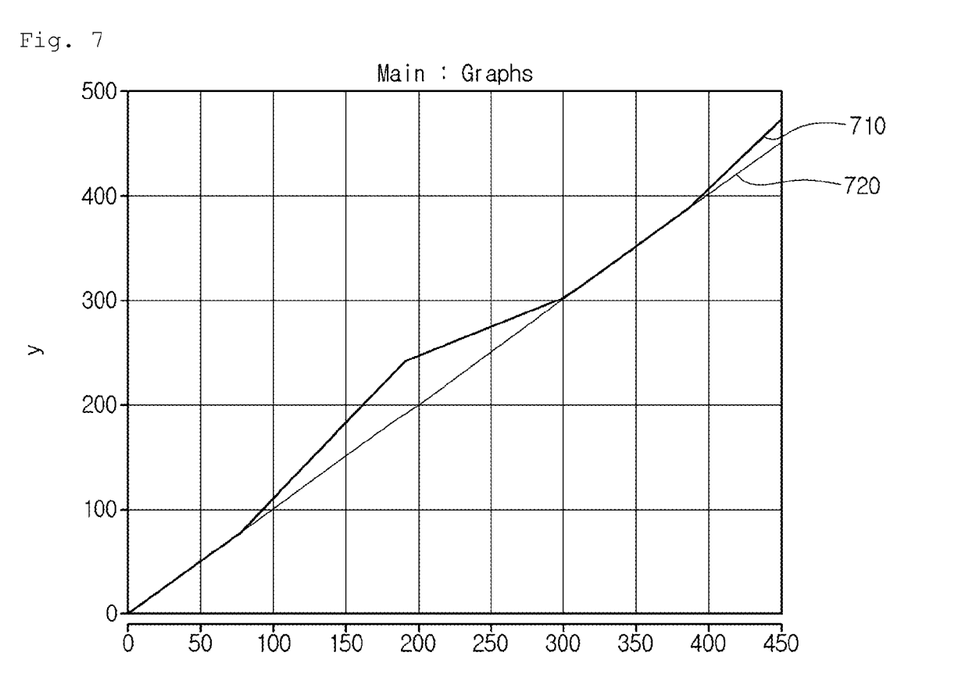
FIGS. 7 and 8 are graphs illustrating the compensation value determining conditions of FIG. 6.
Figure 8:
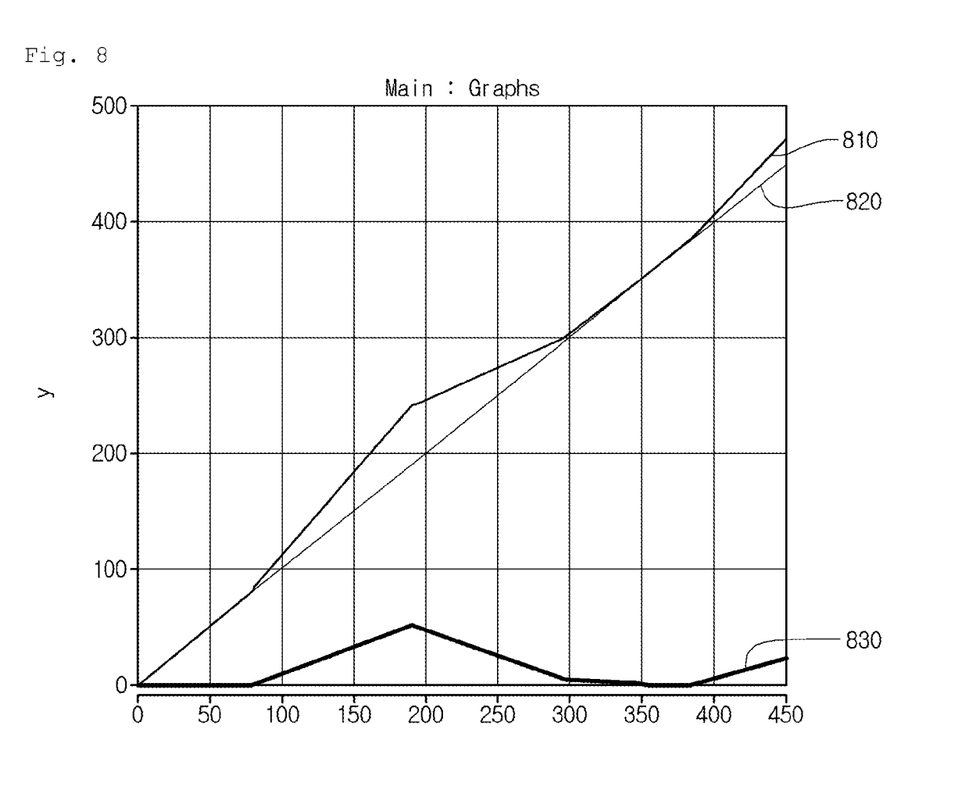

FIG. 6 is a flowchart more specifically illustrating the compensation value determining process illustrated in FIG. 5, and FIGS. 7 and 8 are graphs illustrating the compensation value determining conditions of FIG. 6.

After the current transformers are manufactured and the type test and the routine test are performed normally on the manufactured current transformers, the linearity characteristics of all the manufactured current transformers are confirmed (operation 221). Here, the process of confirming the linearity characteristics includes confirming actual measurement values according to current intervals for each current transformer and confirming the linearity characteristics on the basis of the current intervals and the actual measurement values.

Thereafter, when the linearity characteristics are confirmed, the confirmed linearity characteristics are modeled (operation 222).

FIG. 7 is a graph illustrating a result of modeling the linearity characteristics of the current transformers.

The graph of FIG. 7 illustrates the confirmed linearity characteristics of the current transformers.

Referring to FIG. 7, a first line 710 represents the linearity characteristic of one of the current transformers of which the linearity characteristics have been confirmed, and a second line 720 represents the linearity characteristics of the other current transformers.

Here, the current transformers other than the current transformer represented by the first line 710 have similar linearity characteristics, and thus, the similar linearity characteristics are illustrated as if the similar linearity characteristics are represented by one line. However, the second line 720 actually includes lines corresponding to the modeled current transformers. Accordingly, the second line 720 is thicker than the first line 710.

When the modeling is completed, a compensation interval is defined according to a result of the modeling (operation 223).

That is, according to a result of the modeling, in comparison with the linearity characteristics of a typical current transformer, a current interval with a serious error is confirmed.

When the current interval is confirmed, the error in the current interval is confirmed (operation 224).

Referring to FIG. 8, a first line 810 presents a maximum value of current values of the modeled linearity characteristics, a second line 820 represents a minimum value of the current values, and a third line 830 represents a difference value between the maximum value and the minimum value.

It may be understood that the difference values of the current transformers are greatly differ.

Therefore, an average value of the linearity characteristics of the modeled current transformers is calculated for each current interval, and, if a current transformer that measures a current value that greatly differs from the average value exists, a difference between the average value and the current value is confirmed.

When the difference is confirmed, the influence of the confirmed difference on actual current value is evaluated (operation 225). For example, it is evaluated whether the confirmed difference does not greatly affect the actual current measurement since the confirmed difference is small or whether the confirmed difference causes a serious error of the current measurement since the confirmed difference is large.

Thereafter, according to a result of the evaluation, it is determined whether to compensate the error (operation 226).

When it is determined to compensate the error, a compensation value is determined on the basis of the error, and the determined compensation value is applied to the integrated measurement panel 120 (operation 227).

Thereafter, the linearity characteristic of the current transformer is verified again by applying the determined compensation value, and a test is performed to determine whether the linearity characteristic becomes equal to the average value due to the application of the compensation value (operation 228).

In the graph of FIG. 7 or 8, the horizontal axis represents a current range, i.e., a current interval, and the vertical axis represents a value actually measured by a corresponding current transformer.

Figure 9:
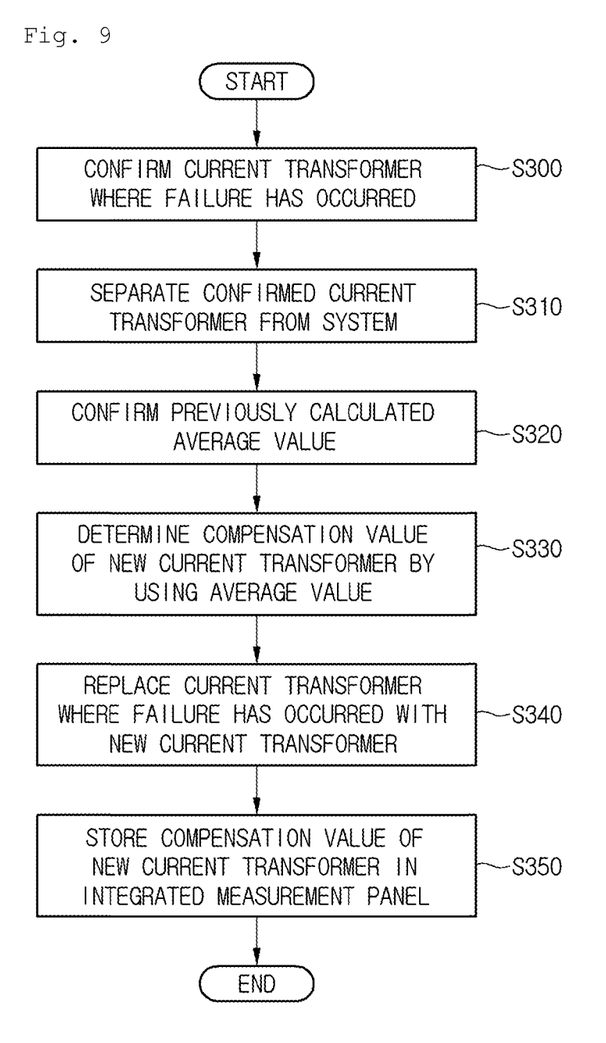
FIG. 9 is a flowchart illustrating a method for replacing a current transformer according to an embodiment.

FIG. 9 is a flowchart illustrating a method for replacing a current transformer according to an embodiment.

After the compensation value is determined for each current transformer and the compensation value is applied to the system, as described above, failure may occur in any one of the current transformers applied to the system due to various conditions. The present disclosure provides a method for easily replacing the current transformer where failure has occurred with a new current transformer.

Referring to FIG. 9, it is determined whether there exists a current transformer where failure has occurred among the plurality of current transformers applied to the system, and, if the current transformer where failure has occurred exists, it is confirmed which one of the plurality of current transformers is the current transformer where failure has occurred (operation 300).

When the current transformer where failure has occurred is confirmed, the current transformer where failure has occurred is separated from the system (operation 310).

In order to replace the current transformer where failure has occurred with a new current transformer, the previously obtained average value is confirmed (operation 320).

The average value has been used to determine the compensation value of the current transformer where failure has occurred.

That is, a location where the new current transformer is applied is the same as that of the current transformer where failure has occurred. Accordingly, an average value which is the same as the average value used for determining the compensation value of the current transformer where failure has occurred is applied to the new current transformer to determine the compensation value of the new current transformer.

In other words, the previously used average value is applied to determine the compensation value of the new current transformer (operation 330). Since the method of determining the compensation value has been described above, detailed descriptions of the method are omitted.

Thereafter, when the compensation value is determined, the current transformer where failure has occurred is replaced with the new current transformer (operation 340).

Then, the compensation value of the new current transformer is stored in the integrated measurement panel (operation 350).

As described above, the average value of the linearity characteristics of current transformers is calculated, and the compensation value for adjusting the linearity characteristics of the current transformers to the average value is determined, so as to resolve the difference between the linearity characteristics of the current transformers by applying the determined compensation value.

According to the embodiments, a current measurement error may be minimized by compensating an error of the linearity characteristic of each current transformer, so that the performance of a current transformer applied to a system is standardized to thereby achieve secure protection of the system and improve the reliability and stability of the system.

Furthermore, according to the embodiments, review and analysis on linearity modeling of each current transformer are performed to apply a compensation value for compensating an error of each current transformer, so that a plurality of current transformers may be connected to one integrated measurement panel, thereby reducing the manufacturing cost.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A power device having a current transformer, the power device comprising:
 first to Nth current transformers;
 an integrated measurement panel connected to the first to Nth transformers and comprising a memory configured to store compensation values for compensating abnormal linearity characteristics for each current interval of one or more current transformers of the first to Nth current transformers, wherein the integrated measurement panel is configured to:

measure current values of locations where the first to Nth transformers are installed using current values detected by the first to Nth transformers;

determine if compensation of each of the measured current values of the first to Nth current transformers is necessary; and compensate one or more of the measured current values using the compensation values stored in the memory when compensation is necessary for the one or more of the measured current values.

2. The power device according to claim 1, wherein the integrated measurement panel is further configured to determine that compensation of a measured current value is necessary when a linearity characteristic of a current transformer corresponding to the measured current falls outside of a normal range based on an average value of the linearity characteristics of the first to Nth current transformers.

3. The power device according to claim 2, wherein the integrated measurement panel is further configured to determine the compensation values differently for each interval to which the current values measured by the first to Nth current transformers belong.

4. The power device according to claim 3, wherein the compensation values include conditions for compensating the measured current values.

5. The power device according to claim 4, wherein the compensation conditions comprise at least one of a current change ratio, an offset value; or a gain value.

6. A compensation method for a current transformer, comprising:

measuring current values of locations where a plurality of current transformers are installed using current values detected by first to Nth transformers of the plurality of current transformer;

determining if compensation of each of the measured current values of the first to Nth current transformers is necessary based on a linearity characteristic of each current transformer; and compensating one or more of the measured current values using the compensation values stored in a memory when compensation is necessary for the one or more measured current values.

7. The compensation method according to claim 6, further comprising determining that compensation of a measured current value is necessary when a linearity characteristic of a current transformer corresponding to the measured current falls outside of a normal range based on an average value of the linearity characteristic of the first to Nth current transformers.

8. The compensation method according to claim 7, further comprising determining the compensation value differently for each interval to which the current values measured by the first to Nth current transformers belong.

9. The compensation method according to claim 7, wherein the compensation values include conditions for compensating the measured current values.

10. The compensation method according to claim 9, wherein the compensation conditions comprise at least one of a current change ratio, an offset value; or a gain value.

* * * * *